United States Patent
Tran et al.

(10) Patent No.: US 8,873,264 B1
(45) Date of Patent: Oct. 28, 2014

(54) DATA FORWARDING CIRCUITS AND METHODS FOR MEMORY DEVICES WITH WRITE LATENCY

(71) Applicant: Cypress Semiconductor Corporation, San Jose, CA (US)

(72) Inventors: Thinh Tran, Palo Alto, CA (US); Joseph Tzou, Mountain View, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 13/795,134

(22) Filed: Mar. 12, 2013

Related U.S. Application Data

(60) Provisional application No. 61/693,178, filed on Aug. 24, 2012.

(51) Int. Cl.
*G11C 15/00* (2006.01)
*G11C 7/22* (2006.01)

(52) U.S. Cl.
CPC . *G11C 7/22* (2013.01); *G11C 15/00* (2013.01)
USPC .................................. 365/49.17; 365/189.07

(58) Field of Classification Search
USPC .......................................... 365/49.17, 189.07
See application file for complete search history.

(56) References Cited

U.S. PATENT DOCUMENTS

| | | | |
|---|---|---|---|
| 5,717,653 A | 2/1998 | Suzuki | |
| 5,829,026 A | 10/1998 | Leung et al. | |
| 6,141,274 A | 10/2000 | Eto et al. | |
| 6,421,286 B1 * | 7/2002 | Ohtani et al. | 365/200 |
| 6,442,103 B1 | 8/2002 | Kwak et al. | |
| 6,539,454 B2 | 3/2003 | Mes | |
| 6,754,126 B2 | 6/2004 | Yamaguchi et al. | |
| 6,954,870 B2 | 10/2005 | Chen et al. | |
| 7,162,657 B2 | 1/2007 | Takahashi et al. | |
| 7,185,216 B1 | 2/2007 | Bhandari et al. | |
| 7,245,552 B2 | 7/2007 | Freebern | |
| 7,246,199 B2 | 7/2007 | Smith et al. | |
| 7,380,084 B2 | 5/2008 | Heuchert et al. | |
| 7,434,023 B2 | 10/2008 | Nodomi et al. | |
| 7,546,399 B2 | 6/2009 | Varma et al. | |
| 2011/0096611 A1 * | 4/2011 | Lee et al. | 365/189.07 |
| 2011/0161581 A1 | 6/2011 | Shin | |
| 2012/0008452 A1 | 1/2012 | Lee | |
| 2012/0327723 A1 | 12/2012 | Taruishi et al. | |

OTHER PUBLICATIONS

Samsung Electronics, 72Mb QDRII SRAM Specification, Mar. 2007.
Cypress Semiconductor Corporation, Interfacing the QDR(TM) with Altera APEX20KE, Mar. 12, 2001.
Renesas Technology Corporation, HM62G18512A Series 9M Synchronous Fast Static RAM (512k-word x 18-bit), Sep. 12, 2001.
U.S. Appl. No. 13/717,637: "Memory Device Data Latency Circuits and Methods" Thinh Tran et al., filed Dec. 17, 2012; 56 pages.

(Continued)

*Primary Examiner* — Huan Hoang

(57) ABSTRACT

A memory device can include a memory array section; a write first-in-first-out circuit (FIFO) configured to transfer write data to the memory array portion; at least one store circuit configured to store a copy of at least a portion of the write data stored in the write FIFO; and an address compare section configured to store write addresses corresponding to the write data of the forwarding circuit.

19 Claims, 9 Drawing Sheets

(56) References Cited

OTHER PUBLICATIONS

Electrosofts.com, "Implementing a FIFO using Verilog," 2005-2007, Retrieved from the World Wide Web at http://electrosofts.com/verilog/fifo.html.

USPTO Non Final Rejection for U.S. Appl. No. 13/717,637 dated Mar. 14, 2013; 9 pages.
USPTO Notice of Allowance for U.S. Appl. No. 13/717,637 dated May 17, 2013; 10 pages.
USPTO Notice of Allowance for U.S. Appl. No. 13/717,637 dated Aug. 5, 2013; 4 pages.

* cited by examiner

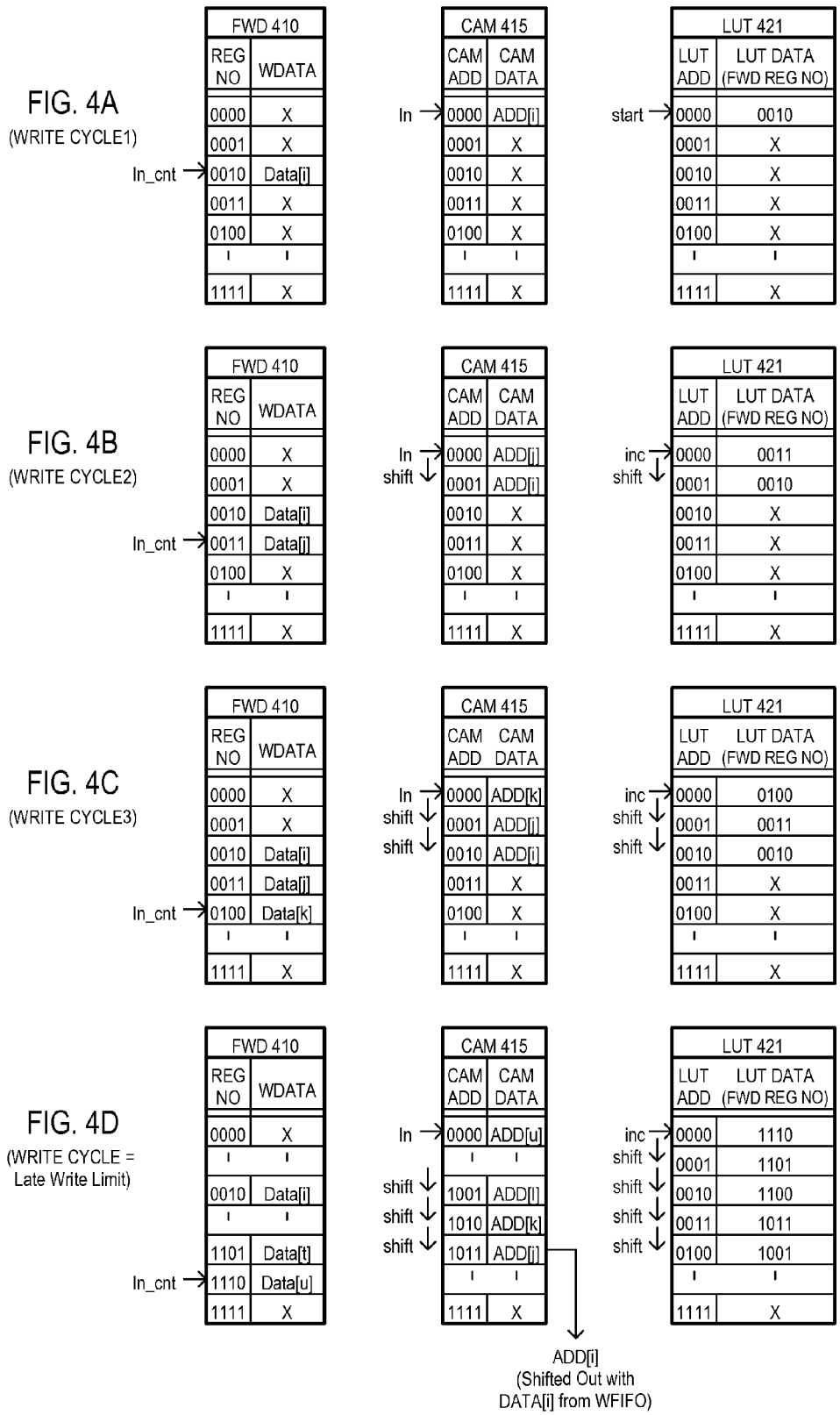

(READ CYCLE - CAM HIT)

US 8,873,264 B1

DATA FORWARDING CIRCUITS AND METHODS FOR MEMORY DEVICES WITH WRITE LATENCY

This application claims the benefit of U.S. provisional patent application Ser. No. 61/693,178 filed on Aug. 24, 2012, the contents of which are incorporated by reference herein.

TECHNICAL FIELD

The present disclosure relates generally to memory devices, and more particularly to memory devices having a latency between the time that write data is received, and such write data is written into a memory array.

BACKGROUND

Synchronous memory devices can operate with data access latencies. A write latency can be the number of clock cycles between the application of a write instruction (and/or address) and the application of write data at data inputs.

Synchronous memory devices can also include a "late" write option. A late write option can defer the writing of data into a memory cell array for a number of clock cycles. Conventional late write options typically defer writes for small number of cycles (i.e., 2-3 cycles). Corresponding to a late write option can be data forwarding. In a data forwarding operation, a read operation can be directed to write data that has yet to be written into a memory cell array. Such write data can be forwarded as read data.

BRIEF DESCRIPTION OF THE DRAWINGS

FIGS. 4A to 4D are diagram showing write operations according to embodiments.

DETAILED DESCRIPTION

Figure 1A:
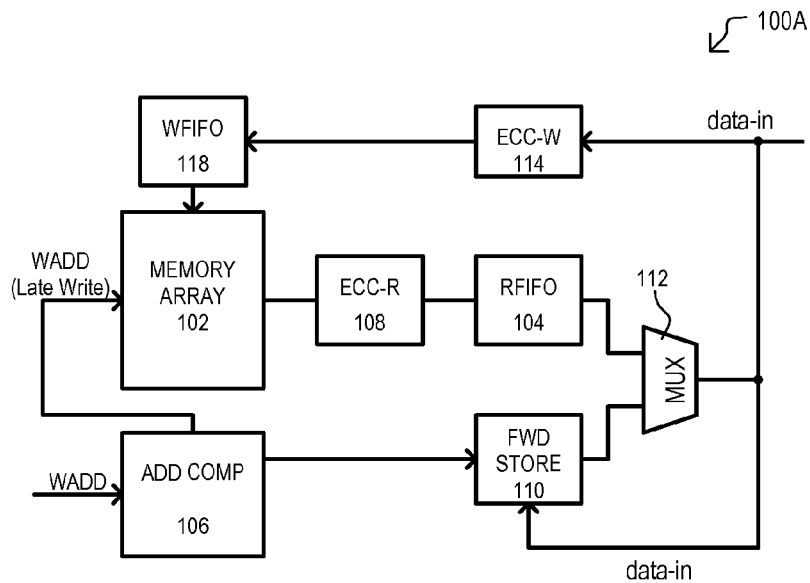
FIG. 1A is a block schematic diagram of a memory device according to an embodiment.

More advanced applications for synchronous devices can benefit from features not present in conventional synchronous memory devices. For example, some applications can benefit from data forwarding among multiple ports. Conventional approaches provide data forwarding for single ports. Some applications can also benefit from a large number of write latency options (e.g., up to five options). Still further, some applications can benefit from relatively long late write options (e.g., up to thirteen clock cycles).

Various embodiments will now be described that include memory devices and methods for supporting data forwarding to multiple ports, as well as a wide range of write latencies, and very long late write options. Embodiments can include applying read addresses to a content address memory (CAM) circuit for comparison to a relative large number of late write addresses. If a match is detected, corresponding write data can be output from a forwarding circuit as read data. A CAM circuit can also operate in a shift-register (SR) like fashion, shifting stored late write addresses. Various write latency options can be achieved by changing depth of the S-R circuit.

In embodiments below, like sections are referred to by the same reference character, but with the leading digit(s) corresponding to the figure number.

Referring now to FIG. 1A, a memory device according to one embodiment is shown in a block schematic diagram and designated by the general reference character 100A. A memory device 100A can include a memory array section 102, a read first-in-first-out circuit (FIFO) 104, an address compare and shift section (hereinafter address compare section) 106, a forward data store 110, a read data multiplexer (MUX) 112, and a write FIFO 118. Optionally, a memory device 100A can also include a read data operation section 108 and write data operation section 114.

A memory array section 102 can include one or more memory cell arrays, corresponding decoder circuits, and data sensing circuits, which can write data into storage locations in response to an applied write address (WADD). A memory array section 102 can include any suitable memory cell type or architectures, including but not limited to: static random access memory (SRAM) type cells, dynamic RAM (DRAM) type cells, pseudo-SRAM type architectures, and/or any suitable non-volatile type memory cells.

A read FIFO 104 can output read data received from a memory array 102 in a first-in-first-out fashion. In particular embodiments, received read data is stored at a FIFO address location indicated by an input pointer, and output from a FIFO address location indicated by an output pointer, with both pointers getting incremented by as data is input to and output from the FIFO 104. A latency introduced by read FIFO 104 can be established by setting a delay between the application of a read command and the activation of control clock which outputs data from the read FIFO 104. This is in sharp contrast to conventional approaches, which can require a re-design of control circuits to establish different latency options.

An address compare section 106 provides write addresses to memory array 102. According to embodiments, an address compare section 106 can output write addresses to memory cell array in a first-in first-out fashion. In particular embodiments, data stored by entries within address compare section 106 can be shifted in a shift-register (SR) like fashion. The depth the entries can provide a desired late write option (for the write addresses). In particular embodiments, an address compare section 106 can have n entries, any of which can be selected to provide an output value, and thus provide a desired latency. As will be shown below, according to embodiments, an address compare section 106 can also provide a fast matching function to compare a received read address to stored late write addresses.

In some embodiments, an address compare section 106 can include a content addressable memory (CAM), that can shift its stored values in a S-R like fashion.

A forward data store 110 can store data for port forwarding operations. That is, a forward data store 110 can store write data corresponding to write addresses stored in (and propagating through) address compare section 106. As will be shown below, according to some embodiments, write data can be output from forward data store 110 in response to a match result from address compare section 106 (i.e., a read address matches a late write address).

A read data MUX 112 can selectively output read data from memory array section 102 or forward data store 110 according to whether or not a match has occurred within address compare section 106. Said in another way, a read data MUX 112 can output read for a standard read operation (i.e., from memory array section 102) or a port forwarding operation (i.e., from forward data store 110).

A write FIFO 118 can provide write data to a memory array section 102 in a first-in-first-out fashion, according to an input pointer and output pointer. Write data can be clocked into write FIFO 118 and output from write FIFO according to signals activated in response to write operations. Like read FIFOs described herein, received write data can be input at a FIFO address location indicated by an input pointer and output from a FIFO address location indicated by output pointer. It is understood that data propagating through write FIFO 118 can be replicated in forwarding circuit 110.

According to particular embodiments, a forward data store 110 can be located close to data input/outputs (I/Os) (which can be physical pads), while a write FIFO 118 can be located close to memory array section 102. Such an arrangement can allow data to be read out at a high frequency.

Optional read data operation section 108 can perform one or more predetermined operations on data output from memory array section 102. In the particular embodiment shown, a read data operation section 108 can be an error correction circuit that can perform error detection and/or correction. However, in other embodiments, a read data operation section can execute other operations, including but not limited to data encryption or decryption circuits, or data scrambling or de-scrambling circuits. In a similar fashion, optional write data operation section 114 can perform one or more predetermined operations on received write data. In the particular embodiment shown, a write data operation section 114 can be an error code generation circuit. However, in other embodiments, a write data operation section can execute other operations, including any of those noted above.

Having described the various sections of a memory device 100A, a write operation for such a memory device will now be described.

A write address (WADD) can be input and stored in address compare section 106. Address compare section 106 can ensure that newer addresses have a highest priority in a matching operation, to enable selection of the newest write data in a data forwarding operation. As noted above, in some embodiments, an address compare section 106 can shift write addresses through entries in a SR like fashion in response to each write operation. Such a feature can also serve to establish priority based on a lowest entry value. A depth of address compare section 106 (i.e., the number of entries shifted through) can establish a size of a late write option. Different late write options can be easily accommodated by tapping different depths of the address compare section 106. Write addresses shifted out of address compare section 106 can be applied to memory array section 102, to access a data storage location for write data output from write FIFO 118.

At the same time, or according to a write latency, write data (data-in) can be input corresponding to a received write address. Such write data can be forwarded to write FIFO 118 (optionally after being operated on by write data operation section 114). Write FIFO 118 can store write data at a location indicated by an input pointer. Subsequently, according to an output pointer, such write data can be applied to memory array section 102. It is understood that write FIFO 118 can have a relatively large number of entries to enable long late write options. Further, various write latencies can be accommodated by varying a number of cycles between the time a write command is received, and write data is clocked in at the input pointer. It is understood that write FIFO 118 operations can be synchronized with address compare section 108 operations, with output pointers advancing in response to each write operation, to ensure the write data output from write FIFO 118 corresponds to a write address output from address compare section 108.

At the same time, the same write data is input to forward data store 110. Like write FIFO 118, forward data store 110 can have a relatively large number of entries to accommodate long late write options. In one very particular embodiment, write data can be input to sequentially higher address locations (e.g., with an input counter).

Figure 1B:
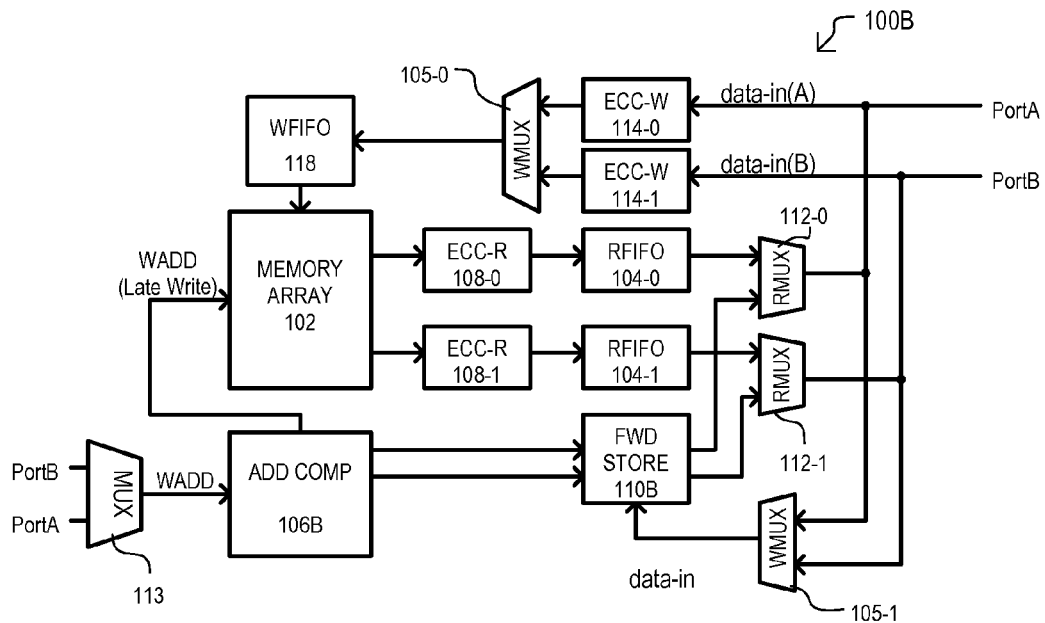
FIG. 1B is a block schematic diagram of a memory device according to another embodiment.

FIG. 1B is a block schematic diagram of a memory device 100B according to another embodiment. A memory device 100B can include sections like those of FIG. 1A, and such like sections are referred to by the same reference character.

FIG. 1B differs from FIG. 1A in that it includes two bi-directional data ports (PortA and PortB). Such data ports can receive write data and output read data on a same set of data lines.

Unlike FIG. 1A, FIG. 1B shows an address MUX 113, and write data MUXes 105-0/1. Further, memory device 100B can include two read FIFOs 104-0/1 and two read MUXes, 112-0/1, each corresponding to a different port. Optionally, a memory device 100B can include two read data operation sections 108-0/1, each corresponding to a different port and/or two write data operation sections 114-0/1, each corresponding to a different port. Read and write data operation sections (108-0/1, 114-0/1) can perform any of those operations described above for FIG. 1A, or equivalents.

An address MUX 113 can input an address from multiple ports. In the embodiment shown, write addresses can be received from two ports (PortA and PortB). In the embodiment shown, such addresses can be stored and shifted within address compare section 106B, as described herein, or equivalents.

A first write data MUX 105-0, can apply write data from either port to write FIFO 118. Similarly, second write data MUX can apply write data from either port to forward data store 110B. In some embodiments, MUXing can be based on a timing signal, such as phases of a periodic clock signal, as but one example.

Read data MUXes 112-0/1 can output read data for the two ports (Port NB). As in the case of FIG. 1A, such read data can originate from memory array section 102, in the event a read address does not match a late write address, or can originate from forward data store 110B, in the event a read address does match a late write address.

Address compare section 106B can receive addresses from either of the two ports, and store them for late write operations, as well as for comparison with incoming read addresses. Address compare section 106B can access forward data store 110B in the event a read address from either port matches a stored late write address. Forward data store 110B can output stored write data (as read data), to enable fast port forwarding.

Figure 1C:
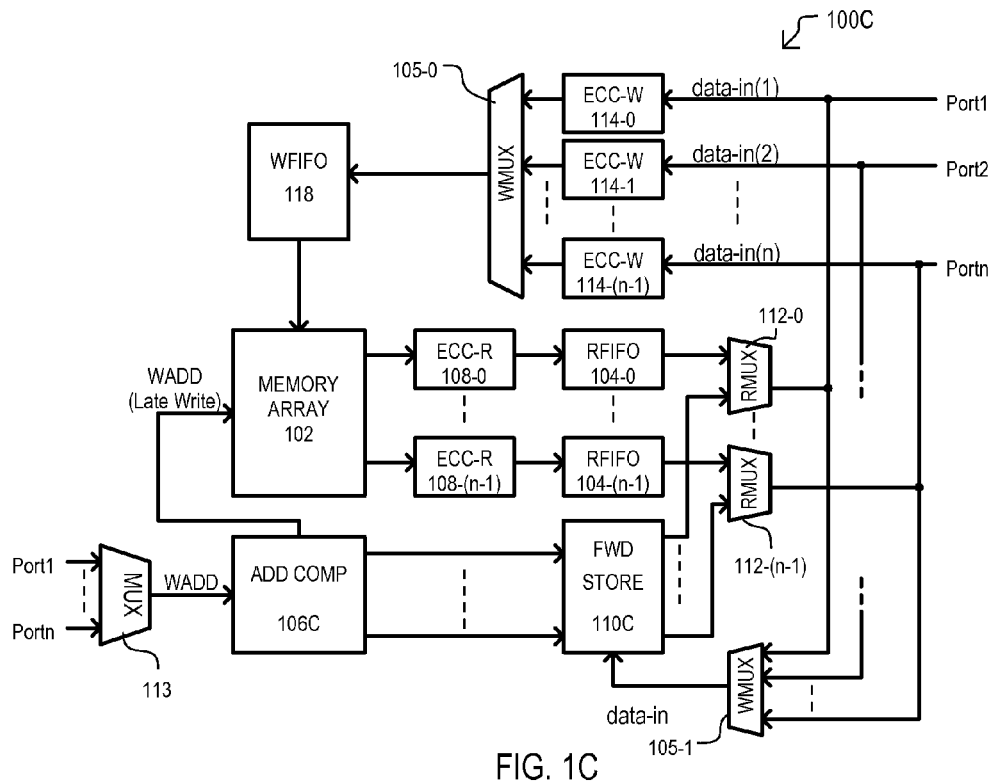
FIG. 1C is a block schematic diagram of a memory device according to a further embodiment.

FIG. 1C is a block schematic diagram of a memory device 100C according to a further embodiment. A memory device 100C can include sections like those of FIG. 1B, and such like sections are referred to by the same reference character.

FIG. 1C differs from FIG. 1B in that it includes more than two bidirectional ports (Port1 to Portn). Accordingly, an address MUX 113 can provide addresses values for any of multiple ports. Write data MUX 105-0 can provide write data from any of the ports to write FIFO 118, and write data MUX 105-1 can provide the same write data from any of the ports to forward data store 110C. In the embodiment shown, a read FIFO (104-0 to 104-(n−1)) can be provided for each port. Optionally, read operation circuits (108-0 to 108-(n−1)) and/or write operations circuits (114-0 to 114-(n−1)) can be provided for each port.

Address compare section 106C can receive addresses from multiple ports, and store them for late write operations, as well as for comparison with incoming read addresses. Like memory device 110B of FIG. 1B, address compare section 106C can access forward data store 110C in the event a read address from either port matches a stored late write address. Forward data store 110C can output stored write data (as read data), to enable fast port forwarding to any of the ports.

Figure 2A:
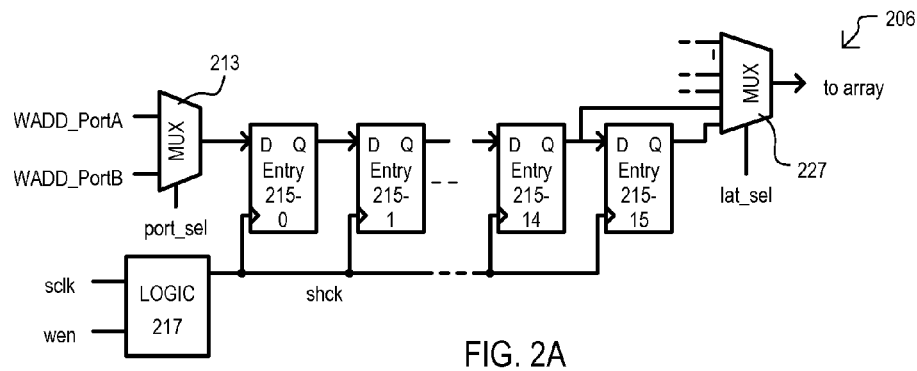
FIG. 2A is a block schematic representation of a content addressable memory (CAM) section in a write operation according to one particular embodiment.
Figure 2B:
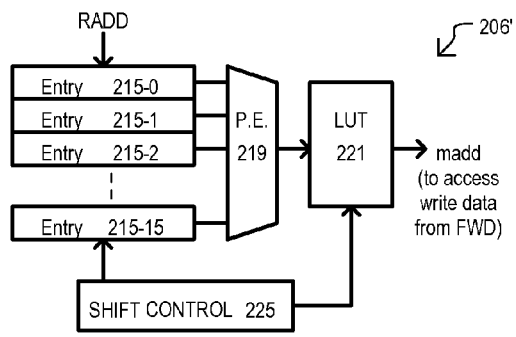
FIG. 2B is a block schematic representation of a CAM section that can be included in embodiments.
Figure 2C:
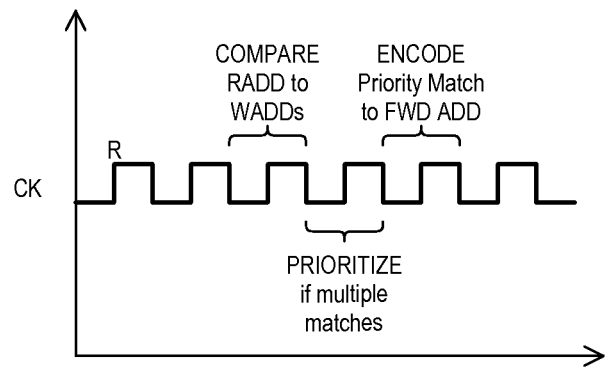
FIG. 2C is a block schematic representation of an address compare section operation according to an embodiment.

FIGS. 2A to 2C are diagrams showing an address compare section and operations according to particular embodiments. As noted above, in some embodiments, an address compare section can include a CAM to enable rapid address comparisons, as well as shifting of addresses in an S-R like fashion. FIG. 2A is a block schematic diagram representation of such a CAM section 206 in a write operation. FIG. 2B is a block schematic diagram of a CAM section 206' according to one embodiment. FIG. 2C is a timing diagram showing operations of a CAM section in a read operation, according to one embodiment.

Referring to FIG. 2A, in a write operation a write address from any of multiple ports can be received. The embodiment of FIG. 2A shows two ports, but alternate embodiments can include a greater number of ports or one port. In the embodiment shown, a write address from either of a PortA (WADD_PortA) or a PortB (WADD_PortB) can be received via an address MUX 213. A received write address can be initially stored in first CAM entry 215-0. However, in response to a subsequent write operation, such a write address can be shifted by operation of a shift clock (shck) in a shift register like fashion. In the embodiment shown, a shift clock (shck) can be generated in response to a timing signal sclk and a write enable signal (wen) generated from a write command. Accordingly, with each new write operation, write addresses are shifted further down into the CAM entries. An address output MUX 227 can have inputs connected to various CAM entries (215-0 to -15). Such an arrangement can establish a depth of the shift-register arrangement. One the inputs to address output MUX 227 can be selected as an output, by operation of value lat_sel. In this way, a size of a late write option can be easily selected by simply changing the value of lat_sel.

Referring to FIG. 2B, in the very particular embodiment shown, a CAM section 206' can include CAM entries 215-0 to -15, priority encoder 219, look-up table (LUT) 221, and shift control circuit 225. CAM entries 215-0 to -15 can store write address values, and as will be described at a later point herein, provide simultaneous comparison to an input value (e.g., read address). A priority encoder 219 can prioritize match results from CAM entries (215-0 to -15) and encode a highest priority match into an output value. LUT 221 can store values (e.g., addresses) that identify the location of the write data corresponding to a matching address, which in this embodiment, is stored in a forwarding circuit (e.g., 110 in FIG. 1). Values in LUT 221 can be accessed according to an output from priority encoder 219.

In a write operation, shift control circuit 225 can enable shifting of addresses stored inside LUT 221. In some embodiments, both the addresses stored in LUT 221 and CAM entries 215-0 to 215-15 can shift in a write operation. At the same time, write data in forward data store (e.g., 110A, 110B, 110C) can remain in their original locations.

FIG. 2C will be described in more detail below, in conjunction with a description of read operations.

Figure 3:
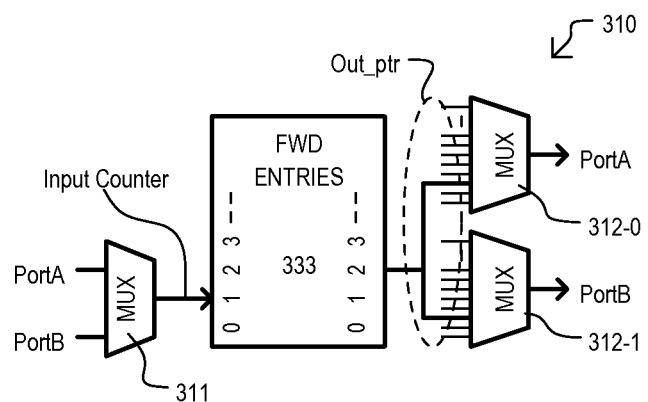
FIG. 3 is block schematic diagram of a forward data store according to an embodiment.

FIG. 3 shows a forward data store 310 according to one particular embodiment. A forward data store 310 can include a number of entries 333 (which should be no less than a depth of a corresponding address compare section (e.g., 106, 206, 206')). Write data values can be written into the forward entries 333 according to an input counter, which can increment address locations (and rollover when a last address is reached). Write data values can be output from forward entries according to an output pointer (Out_ptr). Such a value can be generated from an address compare section, in response to a match between a read address and a stored late write address.

According to embodiments, an output pointer (Out_ptr) can selectively output a write data value from any of the forward entries 333 to any one of multiple ports. In the particular embodiment shown, an output pointer can control output MUXs 312-0/1 to output write data (as read data) to either of two ports (PortA or PortB). However, alternate embodiments can include more than two ports or only one port.

A write data value for input to a forward entry 333 can be received from any of multiple ports. In the embodiment shown, write data can be received from either of two ports (PortA or PortB) via a write data MUX 311.

FIGS. 4A to 4D are diagrams showing the operation of a forwarding circuit 410 and address compare section, according to a particular embodiment. In the figures, the operation of the address compare section is represented by CAM entries 415 and CAM section LUT 421.

FIG. 4A shows responses to an initial write operation. In response to a first write address, the write address value ADD[i] can be stored at an initial CAM entry 0000 indicated by an input value (In). According to input counter (In_cnt) of forwarding circuit 410, corresponding write data (Data[i]) can be stored at forwarding entry 0010. Forwarding entry 0010 can be stored by LUT 421 at entry 0000, indicated by an initial counter value (start).

FIG. 4B shows responses to a second write operation. In response to a second write operation, the first write address ADD[i] can be shifted down to CAM entry 0001. The second write address ADD[j] can then be stored at the first (and higher priority) CAM entry 0000. Within forwarding circuit 410, input counter will have advanced to a next forwarding entry 0011, and the write data for the second write operation (Data[j]) can be stored at that location. Within LUT 421, values can shift in a matching fashion to the CAM entries, with value 0010 shifting to a next LUT address 0001, and the new forwarding entry 0011 can be stored at address 0000. In one embodiment, a value at address 0000 can be incremented (or rolled over) in response to each new write operation.

FIG. 4C shows responses to a third write operation. The operations are understood with reference to FIG. 4B. Within CAM entries 415 and LUT 421 values are shifted downward in an SR-like fashion, while within forwarding circuit 410, input counter can advance further to store a next write data value.

FIG. 4D shows a write operation when a late write limit has been reached. Operations can occur as described above. However, the maximum "depth" of the CAM entries has been reached and the first write address value stored (ADD[j]) can be output from the CAM entries and applied to a memory array section. It is understood that at the same time, a write data value can be applied to the memory array section from a write FIFO (e.g., 118 from FIG. 1).

Figure 5A:
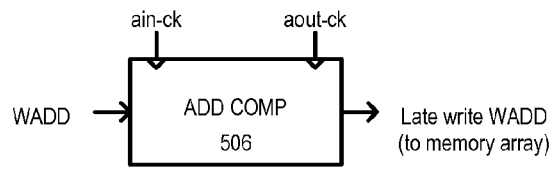
FIG. 5A is a block diagram of an address compare section that can be included in embodiments.

FIG. 5A is a block diagram of an address compare section 506 according to an embodiment. Address compare section 506 can take the form of any of those shown herein, or an equivalent. An address compare section 506 can store a write address value in response to signal ain-ck, and output a write address value (to a memory array section), in response to a signal aout-ck.

Figure 5B:
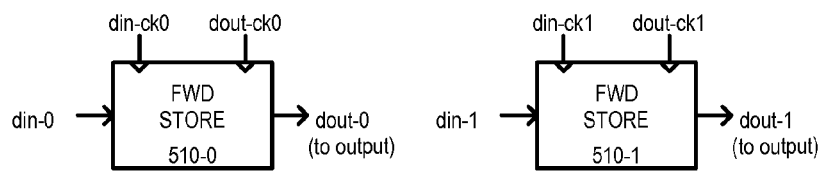
FIG. 5B shows block diagrams of forward data stores that can be included in embodiments.

FIG. 5B shows two forward data stores 510-0/1 in block diagrams. Forward data stores (510-0/1) can store a write data value in response to a signal din-ck0/1 in a write operation, and output a forwarding data (to any of multiple ports) in response to a signal dout-ck0/1 at a read operation (when the read address matches a stored late write address).

Figures 0, 5C:
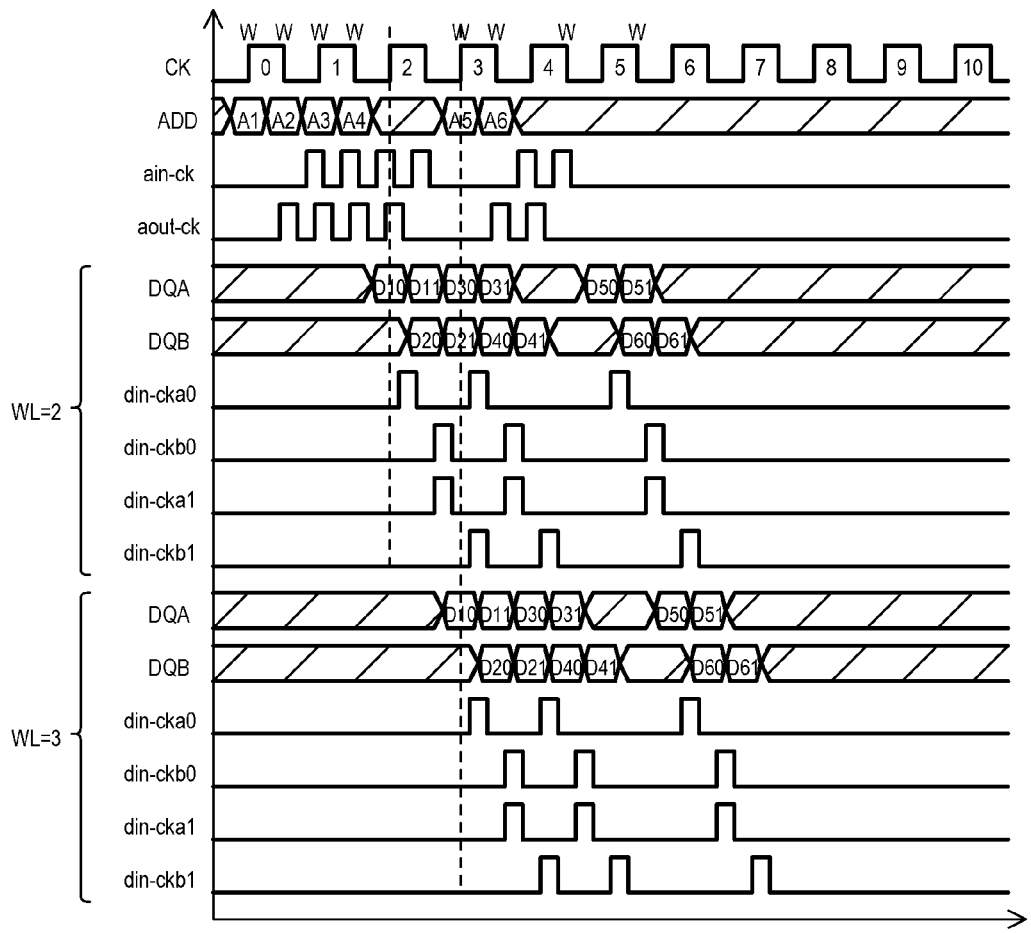
FIGS. 5C-0 and 5C-1 are timing diagrams showing write operations of various latencies according to embodiments.

FIGS. 5C-0/1 are timing diagrams of various signals for a memory device during write operations according to an embodiment. FIG. 5C-0/1 includes the following waveforms: CK, a timing clock; ADD, received addresses (in this case all write addresses); ain-ck, described above; and aout-ck, described above.

Figures 1, 5C:
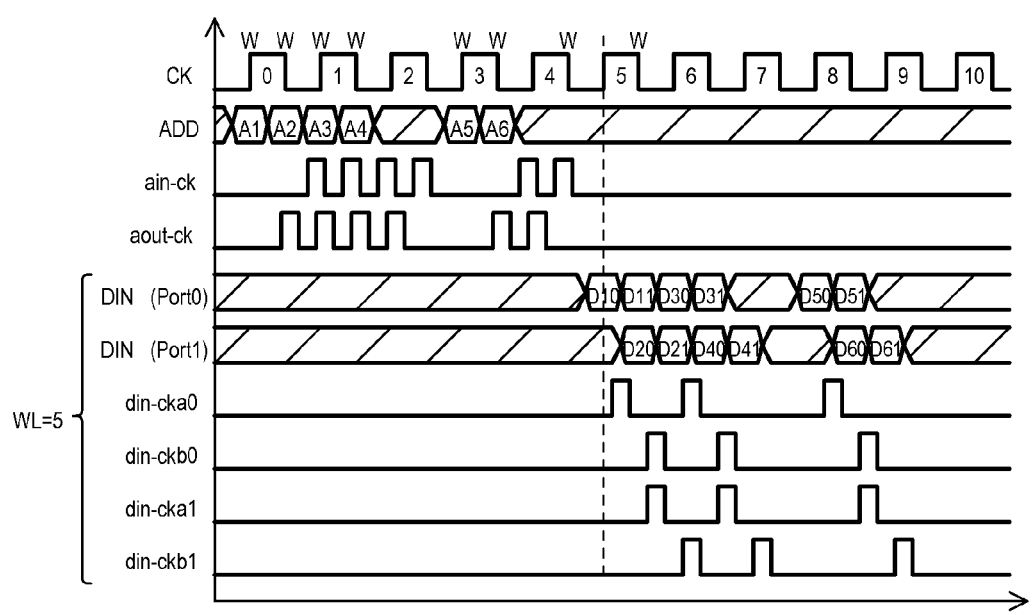

FIGS. 5C-0/1 also show waveforms DQA, data received on one (PortA); DQB, data received on another (PortB); din-cka0/1, which can be din-ck0/1 for one port; and din-ckb0/1, which can be din-ck0/1 for another port. Such waveforms are shown for three different write latency cases. FIG. 5C-0 shows write latencies of 2 and 3 (WL=2, 3), while FIG. 5C-1 shows a write latency of five (WL=5).

In FIGS. 5C-0/1, a "W" above a rising or falling edge of timing clock CK indicates a write operation. Further, write operations occurring on a rising edge of CK are assumed to originate from PortA, while write operations occurring on a falling edge of CK are assumed to originate from PortB.

As understood from the waveforms, various write latencies can be accommodated by setting the delay between the receipt of the write command, and the activation of the din-cka0/1, din-ckb0/1 signals. Also, regardless of the any latency value, with each write operation, an address value is clocked into the address compare section (by activation of ain-ck) and out of the compare section (by activation of aout-ck).

In the embodiment shown, input write data is stored in a corresponding data forward store on the same cycle as it is latched (by activation of din-cka0/1, dinckb0/1).

Figure 5D:
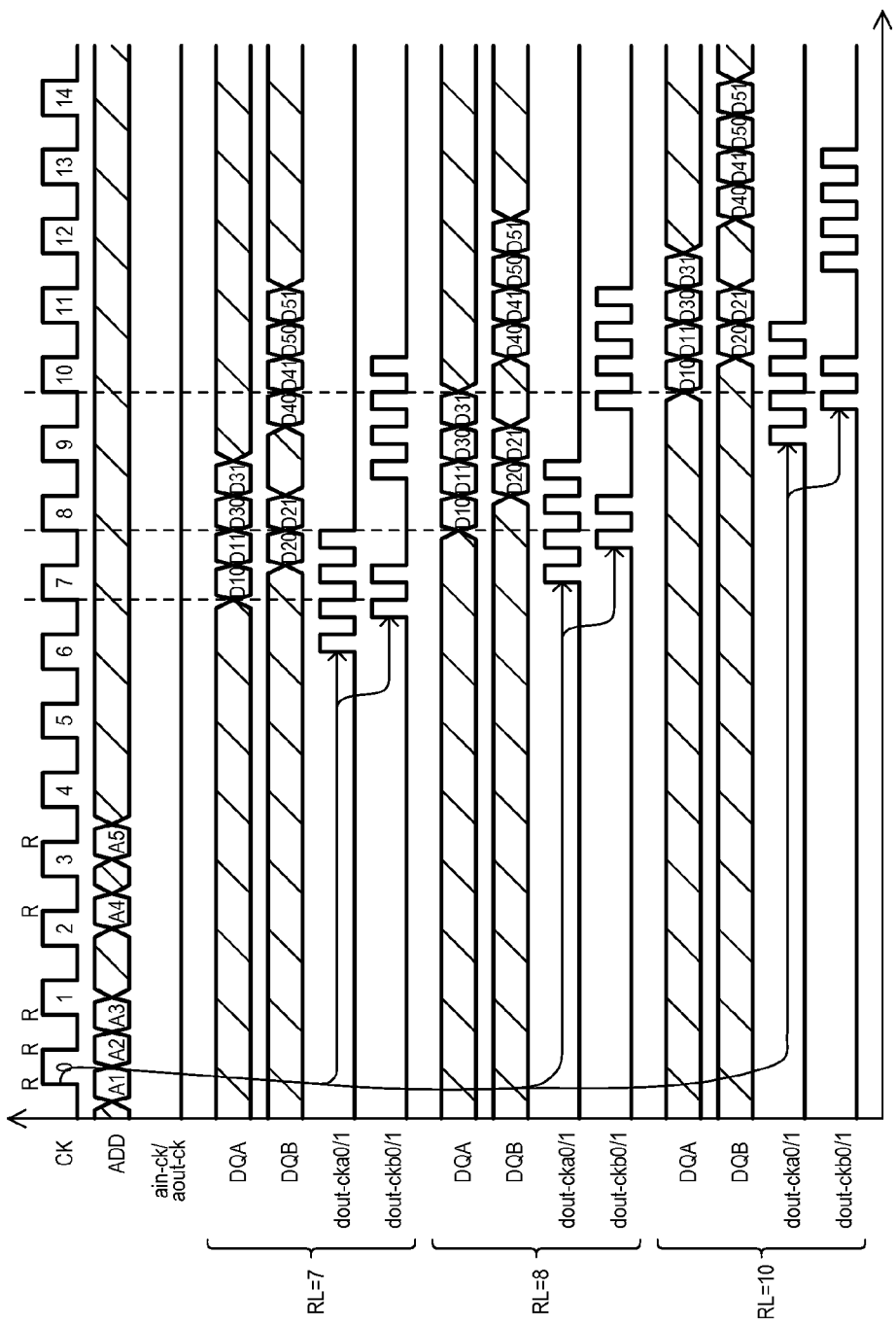
FIG. 5D is a timing diagram showing read operations of various latencies according to embodiments.

FIG. 5D is a timing diagram of various signals for a memory device according to an embodiment for read operations that can result in port forwarding. FIG. 5D includes waveforms shown in FIGS. 5C-0/1. However, it is understood that waveforms DQA/DQB show read data being output on data ports. Further, ADD shows receive read addresses. Unlike FIGS. 5C-0/1, FIG. 5D shows signals dout-cka0/1, dout-ckb0/1, which are the output clocks for data forward stores (shown as dout-ck0/1 in FIG. 5B).

FIG. 5D shows operations for read latencies of seven, eight and 10 (RL=7, 8, 10). In FIG. 5D, an "R" above a rising or falling edge of timing clock CK indicates a read operation. Further, read operations occurring on a rising edge of CK are assumed to originate from PortA, while read operations occurring on a falling edge of CK are assumed to originate from PortB As shown, dout-cka0/1, dout-ckb0/1 can be activated one cycle ahead of an output data time, to enable data to propagate to an output pad.

It is understood that actual data output (e.g., D10, D11, D20, D21 . . . ) can originate from a forward data store in the event a read address matches a late write address, or can originate from a memory array section in the event of no such match.

Figure 6A:
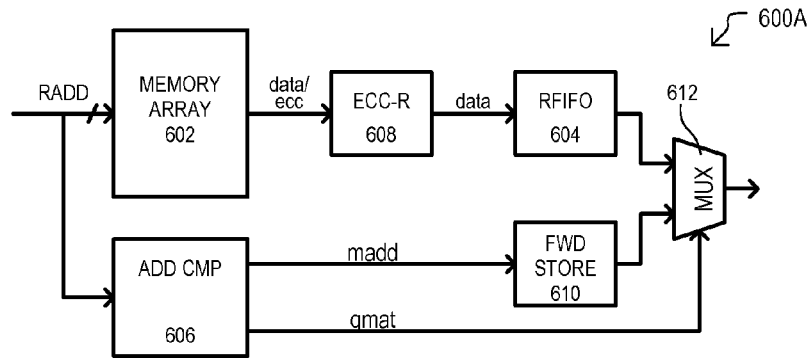
FIG. 6A is a block schematic diagram of a memory device according to another embodiment.

FIG. 6A is a block schematic diagram of a memory device according to another embodiment. A memory device 600A can include items like those of FIG. 1A, and such like items are referred to by the same reference character but with the first digit being a "6" instead of "1". Like items and have the same or equivalent structures and/or functions. In one very particular embodiment, FIG. 6A can show read operations for the memory device of FIG. 1A.

FIG. 6A differs from that of FIG. 1A in that is shows address compare section 606 providing a match address (madd) value to forwarding circuit 610 and a global match value (gmat) to read data MUX 612.

Having described the various sections of a memory device 600A, read operations for such a memory device will now be described.

A read address (RADD) can be input. In some embodiments, a read address can be received with a read command. A read address (RADD) can be applied to both a memory array section 602 and address compare section 606. In response to a read address (RADD) a memory array section 602 can output read data. Optionally, such read data can be operated on by read data operation circuit 608, which can be an error correction circuit in one embodiment. Read data can then be stored in a read FIFO 604. According to read data latency, read data can be output from read FIFO 604 to read data MUX 612.

A read address (RADD) can also be applied to address compare section 606.

Referring back to FIG. 2B, in particular embodiments, in a read operation, a read address (RADD) can be applied to CAM entries (215-0 to -15) simultaneously. Each CAM entry (215-0 to -15) can compare its stored write address to the read address. If a write address of any CAM entry matched the applied read address, a global match signal (gmat) can be activated. In the event more than one write address matches a read address, priority encoder 219 can prioritize such values and encode only the newest received of the matching addresses. A matching address location can be encoded by priority encoder to generate a value that accesses LUT 221. LUT 221 can output a match address (madd) that identifies the forwarding circuit entry containing the write data for the matching write address.

Referring back to FIG. 2C, in one very particular embodiment, a CAM section operation can take three cycles. In a first cycle, read address can be compared to all stored late write addresses. In a next cycle, prioritization operations can occur, to prioritize multiple matches (if present). In a third cycle, a matching write address location can be encoded into a forwarding circuit address, to access corresponding write data.

Referring back to FIG. 6A, in the event a received read address (RADD) does not match any of the late write addresses stored in address compare section 606, value gmat can be de-asserted. In response, read data MUX 612 will output read data from read FIFO 604 (i.e., read data originating from memory array section 602).

In contrast, in the event a received read address (RADD) matches at least one late write address, a port forwarding operation can occur. Address compare section 606 can assert gmat and provide a match address value (madd) to forward data store 610. In response to the match address (madd), forward data store can output the write data corresponding the (newest) matching late write address stored in address compare section 608. In response to an active gmat signal, read data MUX 612 will output the write data from forward data store 610 as read data, and prevent read data from read FIFO 604 from being output.

Figure 6B:
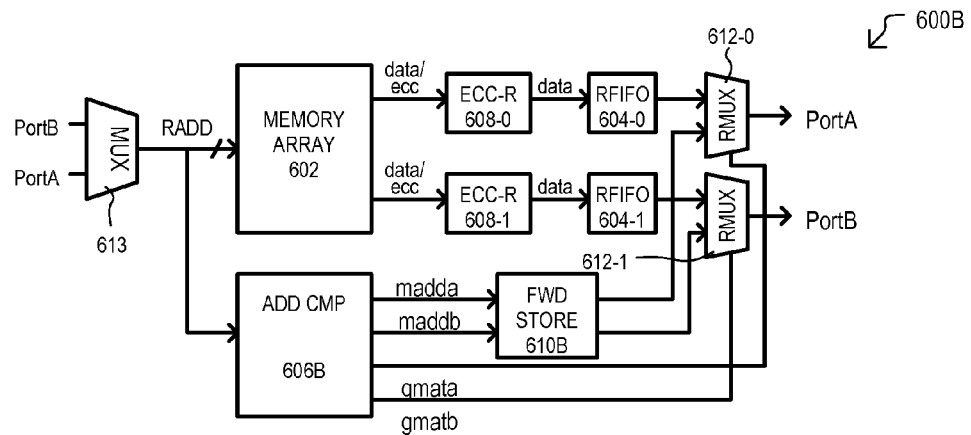
FIG. 6B is a block schematic diagram of a memory device according to another embodiment.

FIG. 6B is a block schematic diagram of a memory device 600B according to another embodiment. A memory device 600B can include sections like those of FIG. 6A, and such like sections are referred to by the same reference character.

FIG. 6B differs from FIG. 6A in that it includes two bi-directional data ports (PortA and PortB). Such data ports can receive write data and output read data on a same set of data lines.

Unlike FIG. 6A, FIG. 6B shows an address MUX 613, two read FIFOs 604-0/1 and two read MUXes 612-0/1, each corresponding to a different port. Optionally, a memory device 600B can include two read data operation sections 608-0/1. Read operation sections 608-0/1 can perform any of those operations described above for FIG. 1A, or equivalents.

An address MUX 613 can input an address from multiple ports. In the embodiment shown, read addresses can be received from two ports (PortA and PortB). Such read addresses can be applied to both memory array section 602 and address compare section 606.

Read data MUXes 612-0/1 can output read data for the two ports (Port A/B). Read data MUXes 612-0/1 can be controlled by signals gmata/b generated by address compare section 606B in the event of a match between a read address and a stored late write address. In very particular embodiment, activation of gmata/b can occur on different portions of a clock cycle.

Address compare section 606B can output a match address (madda/b) and corresponding global match indication (gmata/b) in the event of a match between a read address and stored late write address. In very particular embodiment, match addresses (madda/b) can be output on different portions of a clock cycle.

Figure 6C:
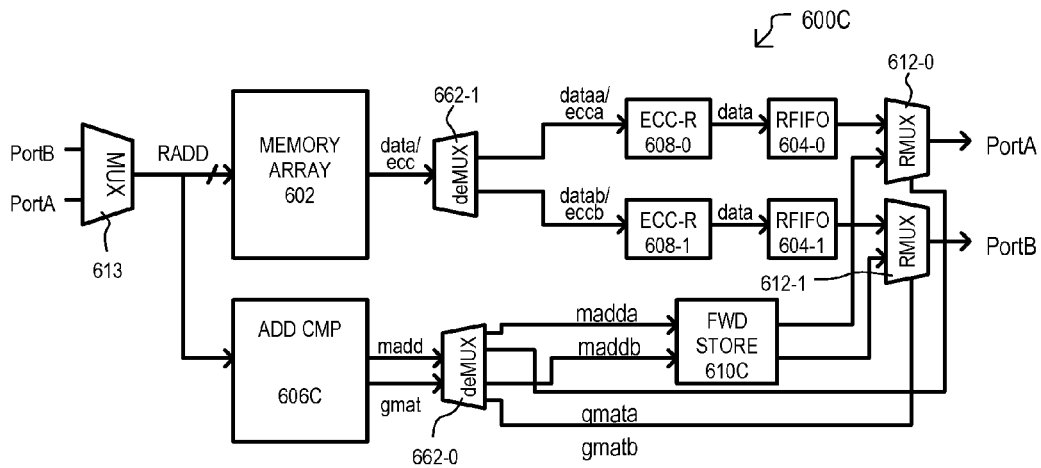
FIG. 6C is a block schematic diagram of a memory device according to another embodiment.

FIG. 6C is a block schematic diagram of a memory device 600C according to another embodiment. A memory device 600C can include sections like those of FIG. 6B, and such like sections are referred to by the same reference character.

FIG. 6C differs from FIG. 6B in that it can include a read data de-multiplexer (deMUX) 662-1 and a match address/indication deMUX 662-0. A read data deMUX 662-1 can output read data to one of multiple read data paths (e.g., read FIFOS 604-0/1). Similarly, deMUX 662-0 can output a match address and global match indication to one or multiple data forwarding paths.

Figure 6D:
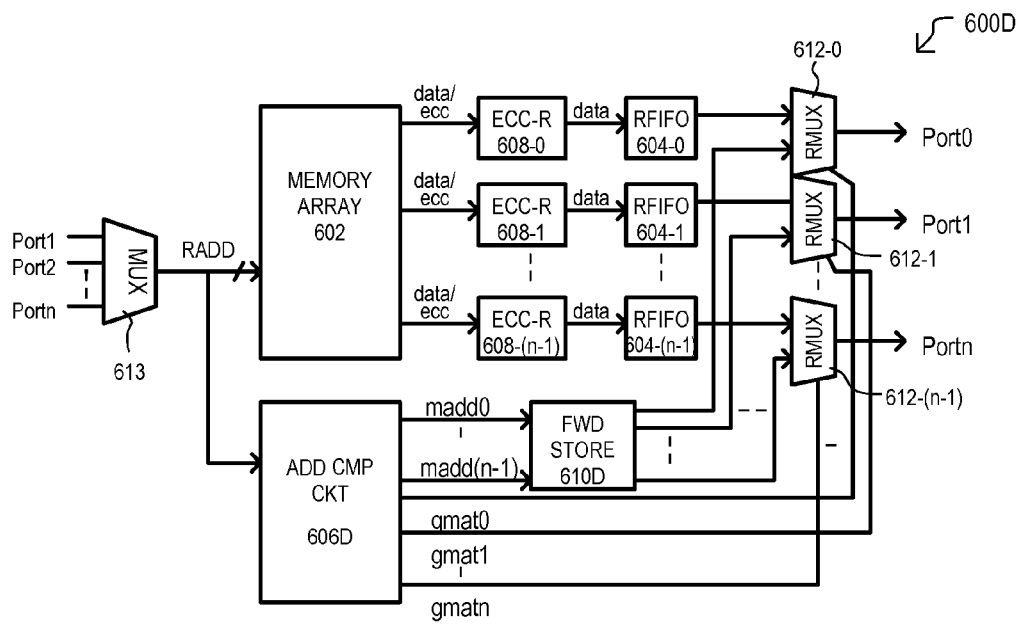
FIG. 6D is a block schematic diagram of a memory device according to another embodiment.

FIG. 6D is a block schematic diagram of a memory device 600D according to a further embodiment. A memory device 600D can include sections like those of FIG. 6B, and such like sections are referred to by the same reference character.

FIG. 6D differs from FIG. 6B in that it includes more than two bidirectional ports (Port1 to Portn). Accordingly, an address MUX 613 can provide addresses values for any of multiple ports. In the embodiment shown, a read FIFO (604-0 to 604-(n−1)) and read MUXes (612-0 to 612-(n−1)) can be provided for each port. Optionally, read operation circuits (608-0 to 608-(n−1)) can be provided for each port.

Address compare section 606D can receive addresses from multiple ports, and store them for late write operations, as well as for comparison with incoming read addresses. In the embodiment shown, address compare section 606D can generate match address values corresponding to each port (madd0 to madd(n−1)), as well as global match indications (gmat0 to gmat(n−1)) for each port.

Forward data store 610D can output write data (corresponding to late write operation) for output in response to match addresses (madd0 to madd(n−1)).

Figure 7:
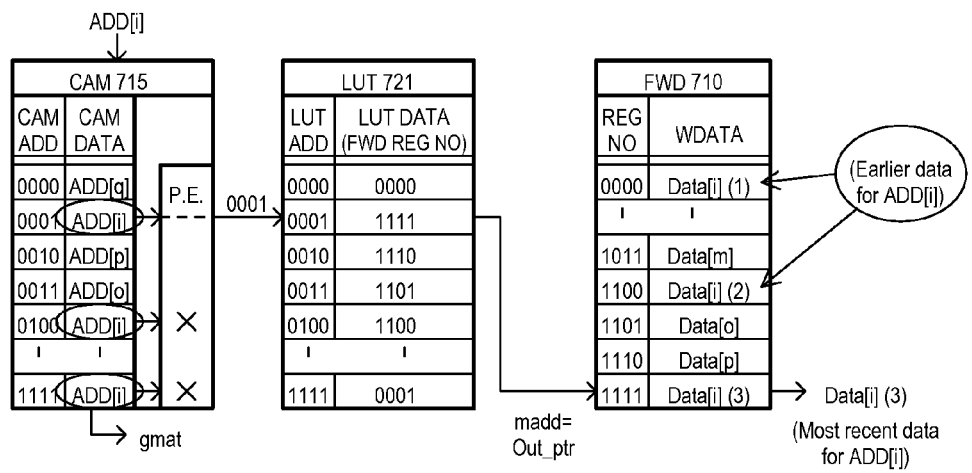
FIG. 7 is a diagram showing a read operation according to one particular embodiment.

FIG. 7 is a diagram showing the operation of an address compare section and forwarding circuit 710, in response to a read operation, according to a particular embodiment. In the embodiment shown, address compare section is represented by CAM entries 715 and LUT 721.

FIG. 7 includes items like those of FIGS. 4A to 4D, and such like items are referred to by the same reference character but with the first digit being a "7" instead of "4". Like items and have the same or equivalent structures and/or functions. In one very particular embodiment, FIG. 7 can show a read operation for the sections of FIGS. 4A to 4D.

In the embodiment shown, in response to a read address, CAM entries 715 can generate three matches (at addresses 0001, 0100 and 1111), indicating three late write operations are in progress to the read address. Priority encoder 719 generates an output value (0001) corresponding to the newest matching entry, which can be the entry with the lowest address.

The output from the priority encoder 719 can be applied to the LUT 721 to generate a forwarding circuit address (madd) corresponding to the appropriate write data. The value madd can serve as the output pointer for the forwarding circuit 710 to select the write data (Data[i] 3) for the matching late write address. Such write data can be output as read data of a port forwarding operation.

It should be appreciated that in the foregoing description of exemplary embodiments, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

It is also understood that the embodiments of the invention may be practiced in the absence of an element and/or step not specifically disclosed. That is, an inventive feature of the invention may be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A memory device, comprising:
   a memory array section;
   a write first-in-first-out circuit (FIFO) configured to transfer write data to the memory array section;

at least one store circuit configured to store a copy of at least a portion of the write data stored in the write FIFO; and an address compare section configured to store write addresses, from any of a plurality of different ports, corresponding to the copy of the write data in the store circuit.

2. The memory device of claim 1, wherein:

the address compare section is further configured to compare a read address to the stored write addresses, and when the read address matches at least one write address, generate a match value; and the store circuit is configured to output a stored write data value in response to the match value.

3. The memory device of claim 1, wherein:

the address compare section comprises a plurality of content addressable memory (CAM) entries, each configured to store a write address value and compare the write address value to a received read address;

wherein the received read address is simultaneously compared to all stored write addresses.

4. The memory device of claim 1, wherein:

the address compare section comprises a content addressable memory (CAM) having a priority encoder configured to prioritize among multiple write addresses that match the read address.

5. The memory device of claim 1, wherein:

the address compare section is configured to shift all stored write addresses to another entry in response to receiving a new write command.

6. The memory device of claim 1, wherein:

the write FIFO is physically located closer to the memory array section than the store circuit; and the store circuit is physically located closer to data input/outputs (I/Os) of the memory device than the write FIFO.

7. The memory device of claim 1, further including:

a plurality of data ports;

the address compare section is configured to generate a global match indication if any stored write address matches a read address; and a read data multiplexer (MUX) corresponding to each data port, each read data MUX having a first MUX input coupled to receive read data from the memory array section, a second MUX input coupled to receive write data from the store circuit, and a MUX output coupled to its corresponding port.

8. A memory device, comprising:

a memory array section;

an address compare section configured to input and store write addresses from any of a plurality of different ports and output write addresses to the memory array section in response to each write command;

a write first-in-first-out circuit (FIFO) configured to input and store write data corresponding to the write addresses stored in the address compare section, and to output the write data to the memory array section in response to each write command; and a forwarding data store configured to input and store the same write data as the write FIFO, and to output the write data in response to output values from the address compare section.

9. The memory device of claim 8, further including:

an address multiplexer (MUX) configured to input the write addresses from any of the plurality of different ports to the address compare section and the memory array section.

10. The memory device of claim 8, further including:

a write data multiplexer (MUX) configured to input the write data from any of a plurality of data ports to the write FIFO and the forwarding data store.

11. The memory device of claim 8, further including:

a plurality of data ports; and a read data multiplexer (MUX) corresponding to each port, each read data MUX having a first MUX input coupled to the memory array section, a second MUX input coupled to the forwarding data store, and an output coupled to its corresponding port.

12. The memory device of claim 11, further including:

at least one read first-in-first-out circuit (FIFO) configured to input read data from the memory array section and output read data to the first MUX input of the read data MUX.

13. The memory device of claim 8, wherein:

the address compare section includes a CAM section comprising, a plurality of CAM entries, and a late write option multiplexer (MUX) having a plurality of MUX inputs, each coupled to a different CAM entry, and a MUX output coupled to the memory array section.

14. The memory device of claim 8, wherein:

the forwarding data store comprises a plurality of forwarding circuit entries, and a plurality of port multiplexers (MUXs), each port MUX having its MUX output coupled to a different port, each port MUX having inputs coupled to each of the forwarding circuit entries.

15. A method, comprising:

receiving a write address from any one of a plurality of different ports;

storing the write address in one of a plurality of address compare entries;

storing a write data corresponding to the write address in a write first-in-first-out circuit (FIFO) and in a forwarding data store different from the write FIFO; and after a predetermined number of write cycles, applying the write address and the write data to a memory array section.

16. The method of claim 15, further including:

comparing a read address to values stored in the address compare entries; and applying the read address to the memory array section.

17. The method of claim 16, further including:

if the read address does not match a write address stored in an address compare entry, outputting read data from the memory array section as the read data for the read address; and if the read address matches at least one write address stored in an address compare entry, outputting write data from the forwarding data store as read data for the read address.

18. The method of claim 17, further including:

outputting the read data for the read address on one of a plurality of data ports.

19. The method of claim 15, further including:

receiving the write address on one transition of a timing clock; and receiving the write data corresponding to the write address on multiple transitions of the timing clock.

* * * * *